(12) United States Patent
Lim et al.

(10) Patent No.: US 8,169,268 B2
(45) Date of Patent: May 1, 2012

(54) OSCILLATION CIRCUIT AND SEMICONDUCTOR DEVICE HAVING THE SAME

(75) Inventors: Ji-Hoon Lim, Suwon-si (KR); Jeong-Don Lim, Seongnam-si (KR); Kwang-Il Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 25 days.

(21) Appl. No.: 12/780,985

(22) Filed: May 17, 2010

(65) Prior Publication Data

US 2011/0001569 A1  Jan. 6, 2011

(30) Foreign Application Priority Data

Jul. 1, 2009  (KR) .................. 10-2009-0059956

(51) Int. Cl.
*H03K 3/03* (2006.01)
*G05F 1/00* (2006.01)
*H03B 5/24* (2006.01)

(52) U.S. Cl. .......... 331/57; 331/173; 327/548; 327/535; 327/536

(58) Field of Classification Search .............. 331/57, 331/173, 174; 327/548, 535, 536, 534, 538
See application file for complete search history.

(56) References Cited

U.S. PATENT DOCUMENTS

| 5,519,360 | A  | * | 5/1996  | Keeth ............................ 331/57 |
| 6,771,100 | B2 |   | 8/2004  | Ishimi |
| 6,809,605 | B2 |   | 10/2004 | Ogawa et al. |
| 7,468,628 | B2 | * | 12/2008 | Im et al. ..................... 327/548 |
| 7,570,104 | B2 | * | 8/2009  | Hsu ............................. 327/536 |

FOREIGN PATENT DOCUMENTS

| JP | 2003015762 A    | 1/2003  |
| JP | 2003209461 A    | 7/2003  |
| KR | 1020030003005 A | 1/2003  |
| KR | 1020030061291 A | 7/2003  |
| KR | 100407569 B1    | 11/2003 |

* cited by examiner

*Primary Examiner* — Ryan Johnson
(74) *Attorney, Agent, or Firm* — Volentine & Whitt, PLLC

(57) ABSTRACT

An oscillation circuit, and a semiconductor device incorporating same, include: an oscillation unit with a plurality of inverters and configured to perform signal transmission between first and second nodes of the inverters such that each of the inverters performs an oscillation operation to generate clock signals having different phases when a control signal is activated, and latch a clock signal of the second node and cut off the signal transmission between the first and second nodes to stop the oscillation operations of the inverters when the control signal is deactivated; and a control unit to activate the control signal when an oscillation enable signal is activated, and deactivate the control signal using one of a clock signal output from an inverter connected to the second node and clock signals of which the phases lag that of a clock signal of the first node, when the oscillation enable signal is deactivated.

10 Claims, 7 Drawing Sheets

OSCILLATION CIRCUIT AND SEMICONDUCTOR DEVICE HAVING THE SAME

PRIORITY STATEMENT

This application claims priority under 35 U.S.C. §119 to Korean Patent Application No. 10-2009-0059956 filed on Jul. 1, 2009, the subject matter of which is hereby incorporated by reference.

BACKGROUND

Embodiments of the inventive concept relate to an oscillation circuit, and more specifically, to an oscillation circuit capable of rapidly and stably terminating an oscillation operation. Embodiments of the inventive concept also relate to semiconductor devices incorporating this type of oscillation circuit.

An oscillation circuit is one within a general class of circuits capable of generating a periodic signal having a constant pulse width. Oscillation circuits generate a periodic signal while so long as power is applied, and stop when power is cut off. Many different types of oscillation circuits are commonly used in semiconductor devices as (e.g.) clock generating circuits, voltage (control signal, or reference signal) generating circuits, etc.

Gated oscillation circuits are a particular subset of oscillation circuits and are capable of controlling an oscillation interval using a logic gate control signal (e.g., an oscillation enable signal). In general, a gated oscillation circuit includes a switch which is connected between specific nodes to control signal transmission. That is, when an oscillation enable signal is activated, the gated oscillation circuit turns ON the switch, such that a signal may be transmitted between nodes, thereby beginning the output of the periodic signal. When the oscillation enable signal is deactivated, the gated oscillation circuit turns OFF the switch to interrupt signal transmission between nodes and halts output of the periodic signal. That is, the oscillation circuit immediately turns OFF the switch when the oscillation enable signal is deactivated.

However, when the switch is turned OFF at the moment that the periodic signal being applied to a node is in an unstable state (i.e., during low-high or high-low transition), then some undefined intermediate level (not a logical "high" or "low" state) will be apparent at the node and a considerable amount of time may be required before the level of the periodic signal is returned to a stable high or low value at the node. Therefore, even if the switch is turned OFF, the oscillation circuit only stops the oscillation operation after some considerable period of additional time. Accordingly, various internal circuits routinely incorporated in contemporary semiconductor devices and operating in response to the periodic signal generated by an oscillation circuit may malfunction.

SUMMARY

Example embodiments provide an oscillation circuit which can rapidly and stably terminate an oscillation operation when an oscillation enable signal is deactivated. Other embodiments provide a semiconductor device incorporating this type of oscillation circuit.

Example embodiments are directed to an oscillation circuit including an oscillation unit including a plurality of inverters and configured to perform signal transmission between first and second nodes of the inverters such that each of the inverters performs an oscillation operation to generate clock signals having different phases, when a control signal is activated, and latch a clock signal of the second node and cut off the signal transmission between the first and second nodes to stop the oscillation operations of the inverters, when the control signal is deactivated; and a control unit configured to activate the control signal when an oscillation enable signal is activated, and deactivate the control signal using one of a clock signal output from an inverter connected to the second node among the plurality of inverters and clock signals of which phases lead that of a clock signal of the first node, when the oscillation enable signal is deactivated.

In example embodiments, the oscillation circuit may include a delay unit including at least one inverter and configured to receive one of clock signals of which phases lag that of the second node and sequentially oscillate the clock signal through the inverters to output to the first node; a transmission unit connected between the first and second nodes and configured to transmit the clock signal of the first node to the second node during the activation period of the control signal; and a latch unit configured to oscillate the clock signal of the second node when the control signal is activated, and latch the clock signal of the second node when the control signal is deactivated.

In example embodiments, the control unit may receive an input signal of an inverter connected to the first node as a first detection signal and an output signal of an inverter connected to the second node as a second detection signal, and when the voltage levels of the first and second detection signals are all stabilized, determine that the voltage level of the clock signal of the second node is stabilized and deactivate the control signal.

In example embodiments, the control unit may include a reset signal generator configured to generate a reset signal which is activated after the oscillation enable signal is deactivated and the voltage levels of the first and second detection signals are all stabilized; and a control signal generator configured to generate the control signal which is deactivated after the oscillation enable signal is deactivated and the reset signal is activated.

In example embodiments, the reset signal generator may include a level setting unit configured to deactivate the reset signal during the activation period of the oscillation enable signal.

Other example embodiments are directed to a semiconductor device including a level discriminator configured to compare a reference voltage and an output voltage and activate an oscillation enable signal when the output voltage is lower than the reference voltage or deactivate the oscillation enable signal when the output voltage is higher than the reference voltage; an oscillation circuit configured to generate a periodic signal in response to the oscillation enable signal; and a voltage generating circuit including a charge pump unit configured to pump the output voltage in response to the periodic signal to adjust a level of the output voltage. The oscillation circuit includes an oscillation unit including a plurality of inverters and configured to perform signal transmission between first and second nodes of the inverters such that each of the inverters performs an oscillation operation to generate clock signals having different phases, when a control signal is activated, and latch a clock signal of the second node and cut off the signal transmission between the first and second nodes to stop the oscillation operations of the inverters, when the control signal is deactivated; and a control unit configured to activate the control signal when the oscillation enable signal is activated, and deactivate the control signal using one of a clock signal output from an inverter connected to the second node among the plurality of inverters and clock signals of which phases lead that of a clock signal of the first node, when the oscillation enable signal is deactivated.

In example embodiments, the oscillation circuit may include a delay unit including at least one inverter and configured to receive one of clock signals of which phases lag that of the second node and sequentially oscillate the clock signal through the inverters to output to the first node; a transmission unit connected between the first and second nodes and configured to transmit the clock signal of the first node to the second node during the activation period of the control signal; and a latch unit configured to oscillate the clock signal of the second node when the control signal is activated, and latch the clock signal of the second node when the control signal is deactivated.

In example embodiments, the control unit may receive an input signal of an inverter connected to the first node as a first detection signal and an output signal of an inverter connected to the second node as a second detection signal, determine that the voltage level of the clock signal of the second node is stabilized, when the voltage levels of the first and second detection signals are all stabilized, and then deactivate the control signal.

In example embodiments, the control unit may include a reset signal generator configured to generate a reset signal which is activated after the oscillation enable signal is deactivated and the voltage levels of the first and second detection signals are all stabilized; and a control signal generator configured to generate the control signal which is deactivated after the oscillation enable signal is deactivated and the reset signal is activated.

In example embodiments, the reset signal generator may include a level setting unit configured to deactivate the reset signal during the activation period of the oscillation enable signal.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Figure 1:
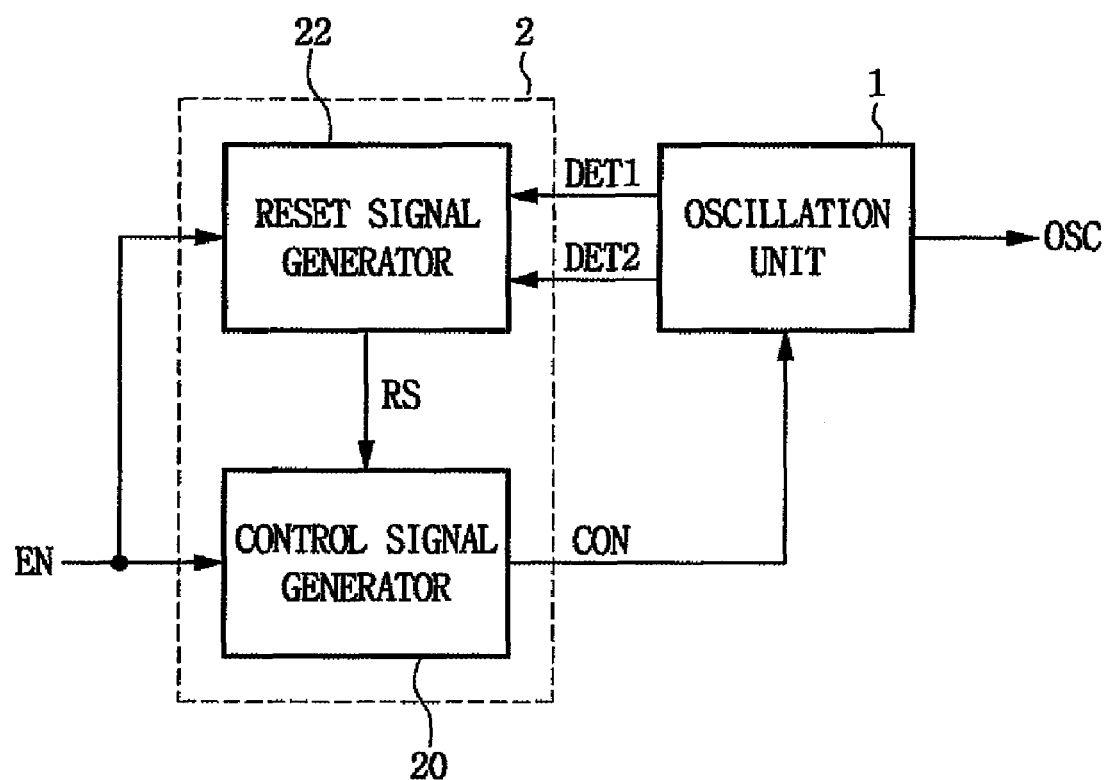
FIG. 1 is a block diagram of an oscillation circuit according to example embodiments.

Various example embodiments will now be described more fully with reference to the accompanying drawings. However, specific structural and functional details disclosed herein are merely representative for purposes of describing the example embodiments. This inventive concept may be embodied in many alternate forms and should not be construed as being limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concept is not limited to example embodiments described.

Hereinafter, an oscillation circuit and a semiconductor device having the same according to example embodiments will be described with reference to the accompanying drawings.

FIG. 1 is a block diagram of an oscillation circuit according to example embodiments. As shown in FIG. 1, the oscillation circuit includes an oscillation unit 1 and a control unit 2. The control unit 2 includes a control signal generator 20 and a reset signal generator 22.

Operation of the oscillation circuit will now be described. First, the oscillation unit 1 performs an oscillation operation during an activation period of a control signal CON to generate a periodic signal OSC having a constant pulse width. On the other hand, when the control signal CON is deactivated, the oscillation unit 1 latches the periodic signal OSC and stops the oscillation operation. Meanwhile, the oscillation unit 1 outputs first and second detection signals DET1 and DET2 for providing a deactivation time point of the control signal CON. The first detection signal DET1 is a signal of which the phase leads that of the second detection signal DET2.

The control unit 2 generates the control signal CON for controlling the oscillation operation of the oscillation unit 1 in response to an oscillation enable signal EN and the first and second detection signals DET1 and DET2. More specifically, when the oscillation enable signal EN is activated, the control unit 2 activates the control signal CON regardless of the first and second detection signals DET1 and DET2. At this time, the oscillation unit 1 starts an oscillation operation in response to the control signal CON. On the other hand, when the oscillation enable signal EN is deactivated, the control unit 2 does not deactivate the control signal CON immediately to stop the oscillation operation of the oscillation unit 1, but deactivates the control signal CON after the voltage levels of the first and second detection signals DET1 and DET2 are all stabilized. The oscillation unit 1 stops the oscillation operation in response to the control signal CON. The first and second detection signals DET1 and DET2 may be stabilized to the same voltage level, or different voltage levels.

Figure 2:
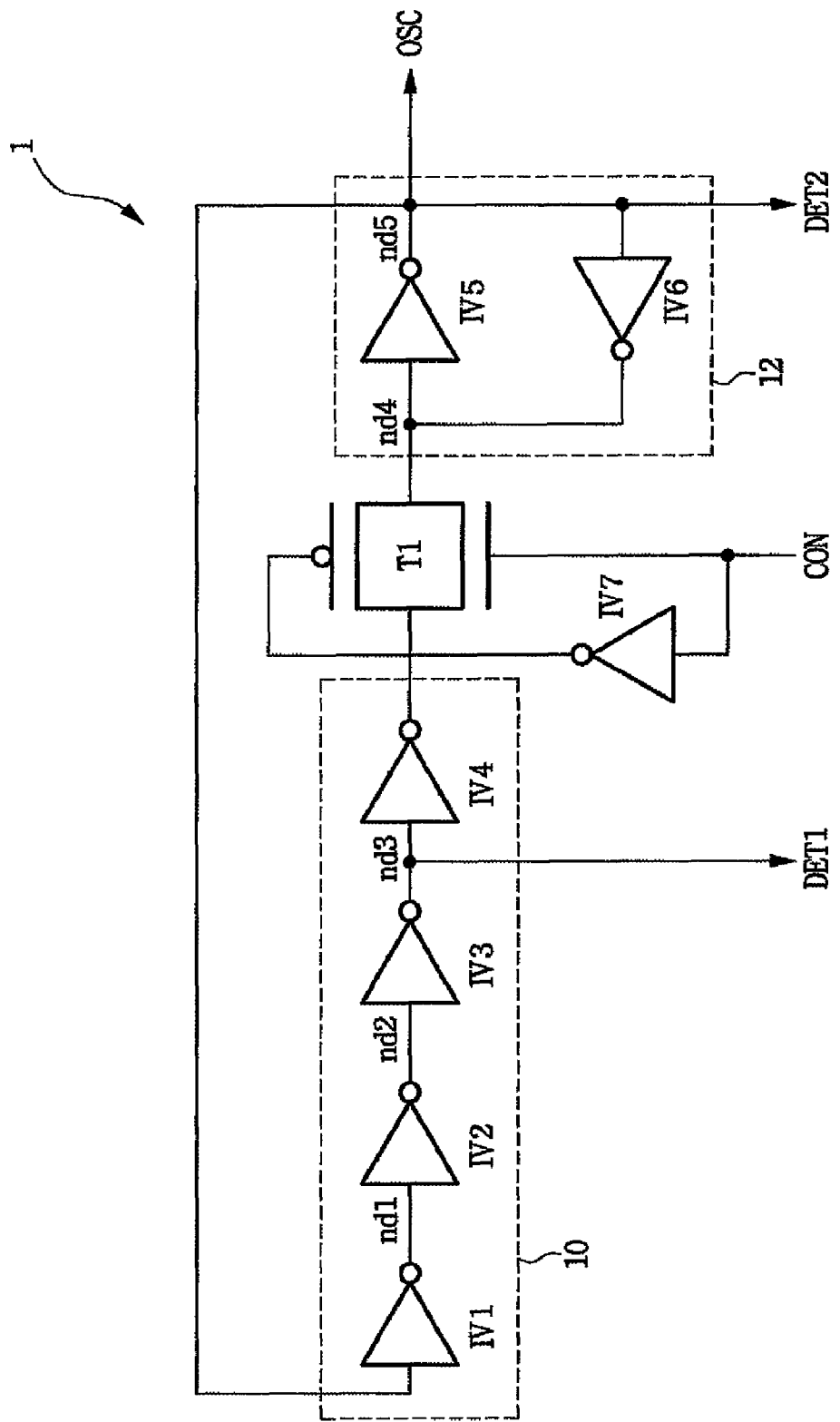
FIG. 2 is a circuit diagram of an oscillation unit of FIG. 1.

FIG. 2 is a circuit diagram further illustrating one possible embodiment of the oscillation unit of FIG. 1. As shown in FIG. 2, the oscillation unit 1 comprises a delay unit 10, a transmission gate T1, and a latch unit 12.

The delay unit 10 includes a plurality of inverters IV1 to IV4, and receives the periodic signal OSC and sequentially inverts the periodic signal OSC to output a plurality of clock signals. The transmission gate T1 is connected between the delay unit 10 and the latch unit 12, and transmits an output signal of the delay unit 10 as an input signal (signal of node nd4) of the latch unit 12 during the activation period of the control signal CON. The latch unit 12 generates a periodic signal OSC by oscillating the output signal of the delay unit 10 transmitted through the transmission gate T1 during the activation period of the control signal CON. When the control signal CON is deactivated, the latch unit 12 latches the periodic signal OSC and cuts off a connection between the delay unit 10 and the latch unit 12 to stop the oscillation operation. One inverter IV6 between two inverters IV5 and IV6 composing the latch unit 12 has a lower driving ability than the other inverter IV5 to prevent the inverter IV6 from driving the output signal of the delay unit 10 during the oscillation operation and interrupting the oscillation operation.

Figure 3:
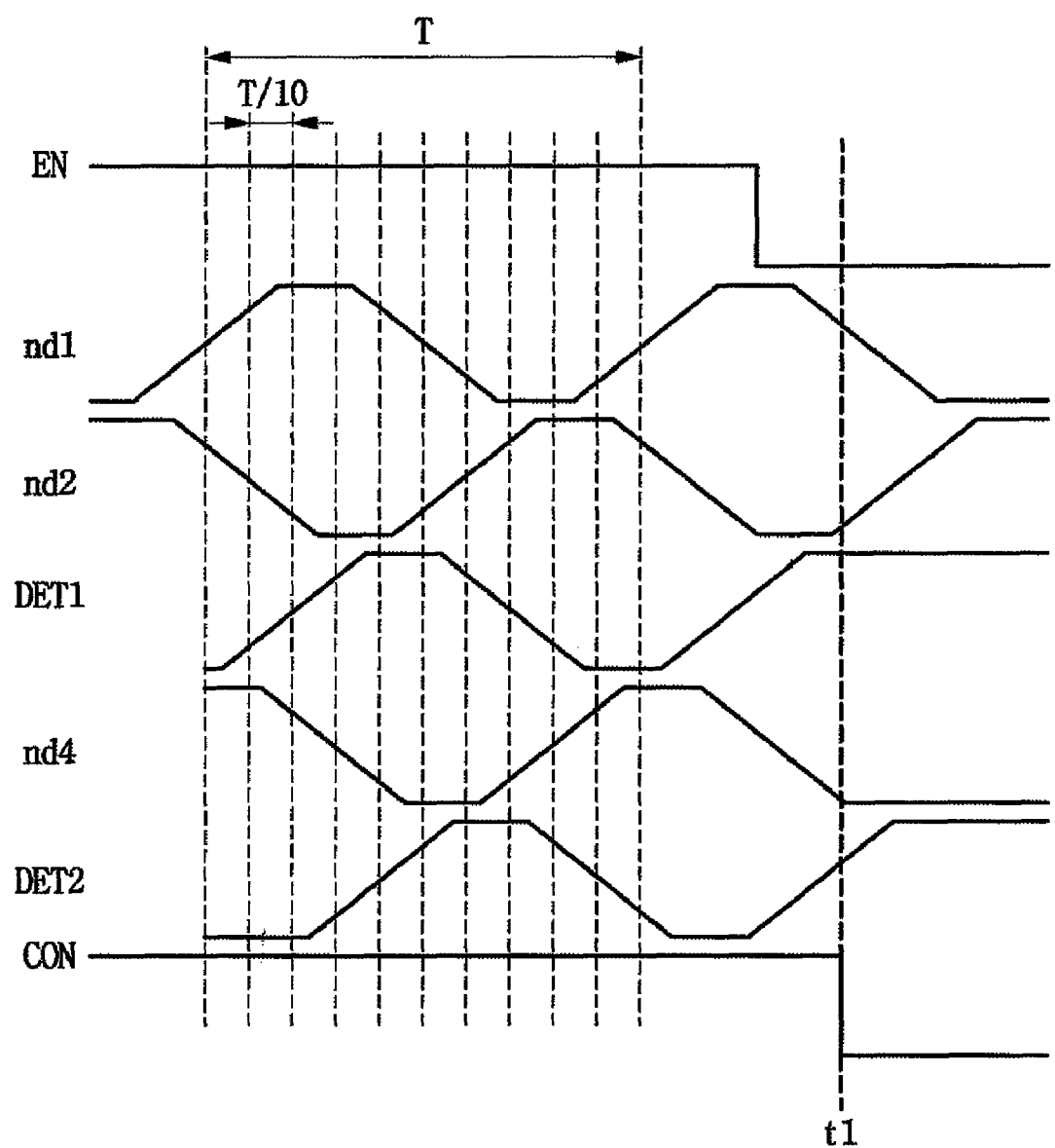
FIG. 3 is a timing diagram for explaining the operation of the oscillation unit of FIG. 2.

FIG. 3 is a timing diagram further explaining one possible operation for the oscillation unit.

First, when the oscillation enable signal EN is activated, the operation of the oscillation unit 1 may be performed as follows.

During an activation period of the oscillation enable signal EN, the control signal CON is activated at a high logical state (hereafter, "high" and analogously "low" for an opposite logic state). At this time, the transmission gate T1 is turned ON in response to the control signal CON. Therefore, an output signal of the delay unit 10 is transmitted to the latch unit 12, and the latch unit 12 inverts the output signal of the delay unit 10 to oscillate the periodic signal OSC. Then, the periodic signal OSC is fed back to the delay unit 10. Since the periodic signal OSC input to the delay unit 10 is sequentially oscillated by the five inverters IV1 to IV5, the inverters IV1 to IV5 generate clock signals having phases different from one another. The periodic signal OSC, a clock signal output from the inverter IV5, is continuously toggled during the activation period of the control signal CON. The oscillation unit 1 is one example of a ring oscillator composed of five inverters IV1 to IV5, and the respective inverters IV1 to IV5 delay the respective signals by 1/10 of a period T.

Next, when the oscillation enable signal EN is deactivated, the operation of the oscillation unit 1 may be performed as follows.

When the oscillation enable signal EN is deactivated to low, the control unit 2 maintains the deactivation period of the control signal CON until the voltage levels of the first and second detection signals DET1 and DET2 extracted from the oscillation unit 1 are all stabilized. Therefore, the transmission gate T1 maintains the turned ON state in response to the control signal CON, and the oscillation unit 1 continuously performs the oscillation operation through the inverters IV1 to IV5. Thereafter, when the second detection signal DET2 is stabilized at high in a state in which the first detection signal DET1 has already been stabilized high, the control unit 2 deactivates the control signal CON to low at a point in time t1. At this time, the transmission gate T1 is turned OFF to cut off signal transmission between the delay unit 10 and the latch unit 12. Therefore, the input signal (signal of node nd4) of the latch unit 12 is latched, and the oscillation operation of the oscillation unit 1 is stopped. That is, when the control signal CON is deactivated, the oscillation unit 1 latches the periodic signal OSC, and stops the oscillation operation.

Referring to FIG. 3, the phase of the first detection signal DET1 leads that of the input signal (signal of node nd4) of the latch unit 12 by 1/10 of the period T, and the phase of the second detection signal DET2 lags that of the input signal (signal of node nd4) of the latch unit 12 by 1/10 of the period T. Although it is illustrated that the first and second detection signals DET1 and DET2 are all stabilized high, the first and second detection signals DET1 and DET2 may be stabilized at different voltage levels when signals of different nodes of the oscillation unit 1 are used as the first and second detection signals DET1 and DET2. However, while the voltage levels of the first and second detection signals DET1 and DET2 maintain the stabilized state, the input signal (signal of node nd4) of the latch unit 12 is also stabilized.

As such, the control unit 2 does not deactivate the control signal CON immediately after the oscillation enable signal EN is deactivated, but deactivates the control signal CON after the voltage levels of the first and second detection signals DET1 and DET2 are all stabilized and the voltage level of the input signal (signal of node nd4) of the latch section 12 is thus stabilized. Even if the voltage levels of the first and second detection signals DET1 and DET2 are not stabilized at a point in time when the oscillation enable signal EN is deactivated, the voltage levels of the first and second detection signals DET1 and DET2 reach the stabilized state within ½ of the period T of the periodic signal OSC.

In certain embodiments, the voltage levels of the first and second detection signals DET1 and DET2 are checked to determine the stabilized state of the input node nd4 of the latch unit 12 whose connection with the delay unit 10 is cut off by the transmission gate T1 and to determine the stabilized state of the second detection signal DET2, an output signal (signal of node nd5) of the latch unit 12. The control signal CON may be deactivated after the voltage levels of the input signal (signal of node nd4) and the output signal (signal of node nd5) of the latch unit 12 are all stabilized. However, only the input signal of the latch unit 12, which is a signal of the node nd4 directly connected to the delay unit 10 through the transmission gate T1, may be determined to deactivate the control signal CON depending on the stabilized state of the input signal (signal of node nd4) of the latch unit 12.

Figure 4:
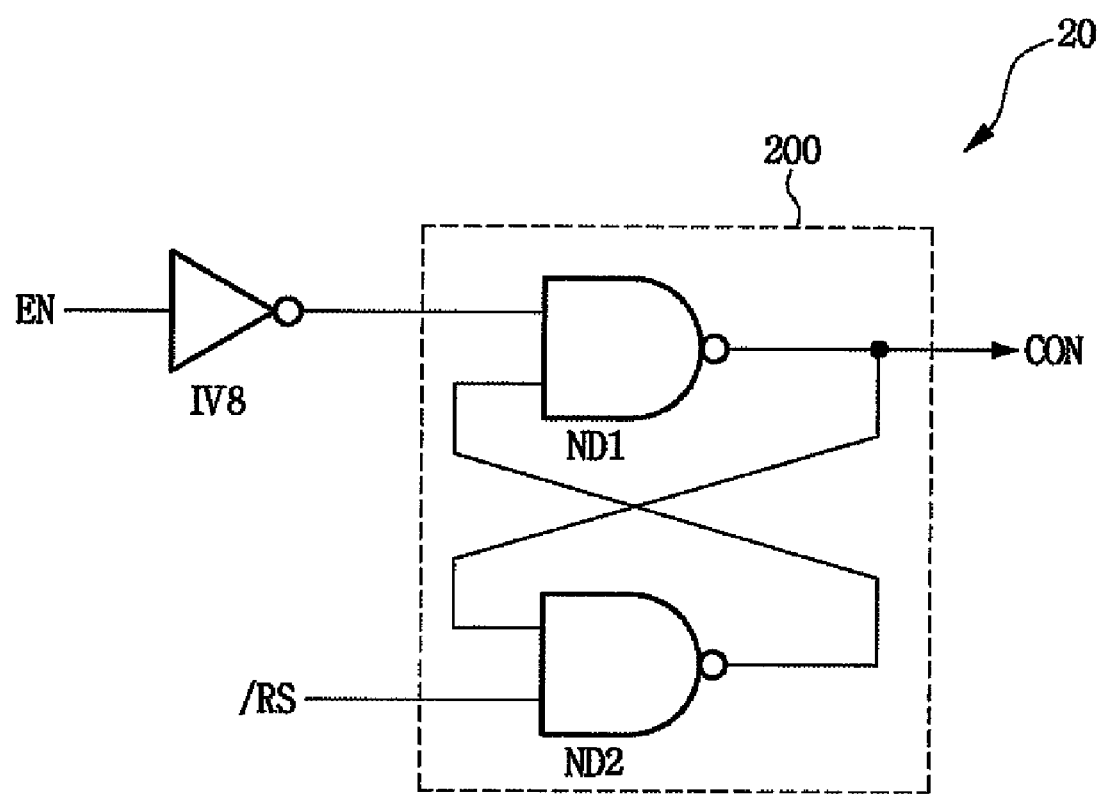
FIG. 4 is a circuit diagram of a control signal generator of FIG. 1.

FIG. 4 is a circuit diagram showing one possible example of the control signal generator of FIG. 1. As shown in FIG. 4, the control signal generator 20 comprises an inverter IV8 and a RS latch 200.

The operation of the control signal generator 20 configured in such a manner may be performed as follows.

When the oscillation enable signal EN is activated to high, the control signal generator 20 activates the control signal CON to high regardless of a reset signal/RS. When the oscillation enable signal EN is deactivated to low, the control signal generator 20 maintains the activation period of the control signal CON until the reset signal/RS is activated to low, and then deactivates the control signal CON to low when the reset signal/RS is activated.

Figure 5:
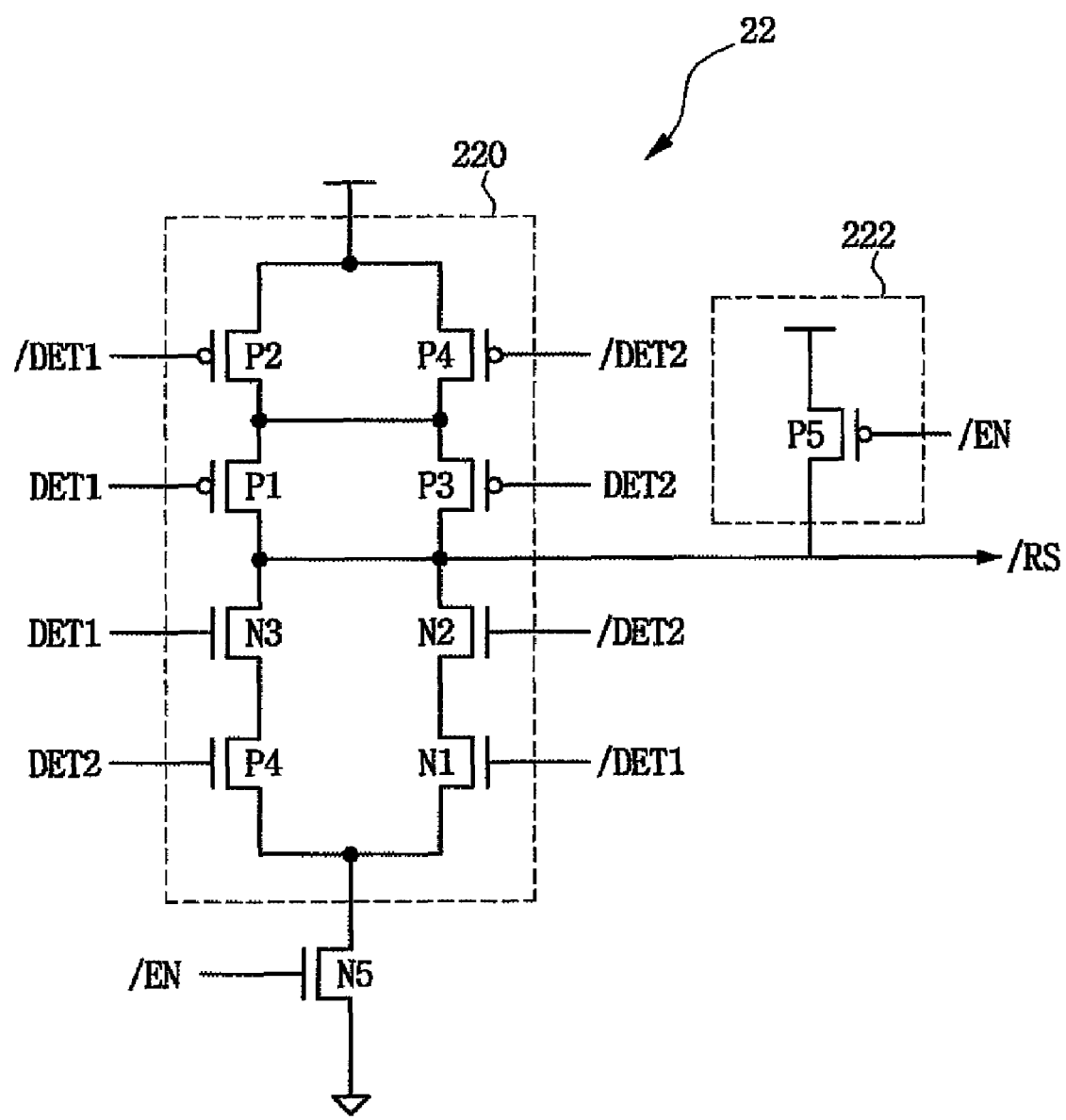
FIG. 5 is a circuit diagram of an example of a reset signal generator of FIG. 1.

FIG. 5 is a circuit diagram showing one possible example of the reset signal generator of FIG. 1. As shown in FIG. 5, the reset signal generator 22 comprises a logic unit 220 and a level setting unit 222.

The level setting unit 222 deactivates the reset signal/RS to high through a PMOS transistor P5 which is turned ON when the oscillation enable signal EN is activated to high. The logic unit 220 operates during the deactivation period of the oscillation enable signal EN. More specifically, when both of the first and second detection signals DET1 and DET2 are low, the logic unit 220 activates the reset signal/RS to low through NMOS transistors N1 and N2, and when both of the first and second detection signals DET1 and DET2 are high, the logic unit 220 activates the reset signal/RS to low through NMOS transistors N3 and N4. On the other hand, when the first and second detection signals DET1 and DET2 are low and high, respectively, the logic unit 220 deactivates the reset signal/RS to high through PMOS transistors P1 and P4, and when the first and second detection signals DET1 and DET2 are high and low, respectively, the logic unit 220 deactivates the reset signal/RS to high through PMOS transistors P2 and P3.

That is, the reset signal generator 22 deactivates the reset signal/RS to high during the activation period of the oscillation enable signal EN, and activates the reset signal/RS to low after the oscillation enable signal EN is deactivated to low and the voltage levels of the first and second detection signals DET1 and DET2 are all stabilized.

Figure 6:
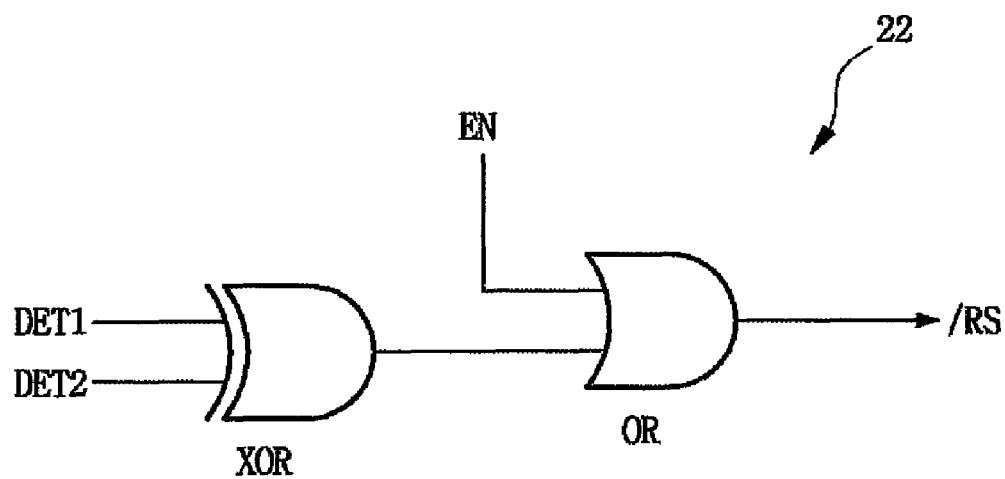
FIG. 6 is a circuit diagram of another example of the reset signal generator of FIG. 1.

FIG. 6 is a circuit diagram illustrating another example of the reset signal generator of FIG. 1. As shown in FIG. 6, the reset signal generator 22 comprises an exclusive OR gate (XOR) and an OR gate (OR).

The operation of the reset signal generator 22 configured in such a manner may be as follows.

The reset signal generator 22 fixes the reset signal/RS to high during the activation period of the oscillation enable signal EN to prevent unnecessary toggling. When the oscillation enable signal EN is deactivated to low, the reset signal generator 22 activates the reset signal/RS to low after the voltage levels of the first and second detection signals DET1 and DET2 are all stabilized.

Figure 7:
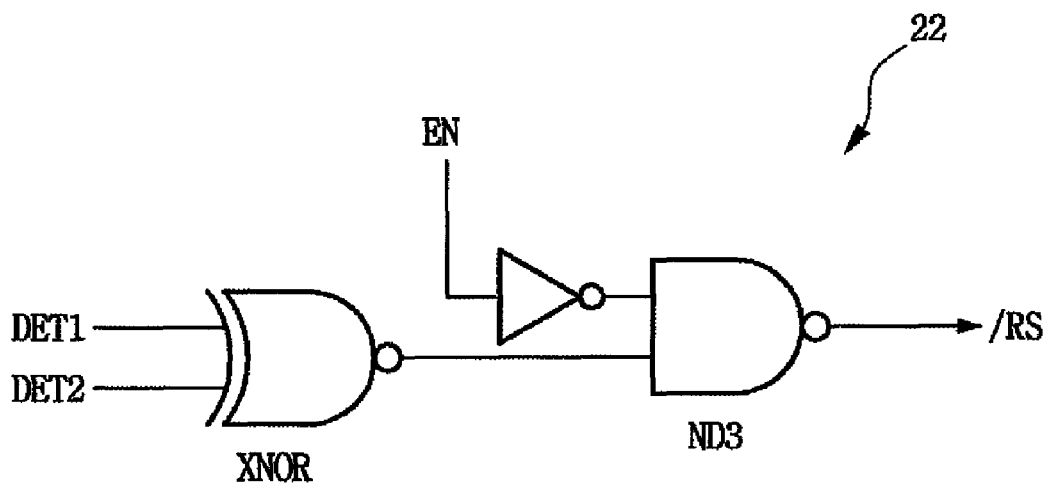
FIG. 7 is a circuit diagram of still another example of the reset signal generator of FIG. 1.

FIG. 7 is a circuit diagram showing still another possible example of the reset signal generator of FIG. 1. As shown in FIG. 7, a reset signal generator 22 comprises an exclusive NOR gate (XNOR) and a NAND gate (ND3).

The operation of the reset signal generator 22 configured in such a manner may be as follows.

The reset signal generator 22 fixes the reset signal/RS to high during the activation period of the oscillation enable signal EN to prevent unnecessary toggling. When the oscillation enable signal EN is deactivated to low, the reset signal generator 22 activates the reset signal/RS to low after the voltage levels of the first and second detection signals DET1 and DET2 are all stabilized.

Figure 8:
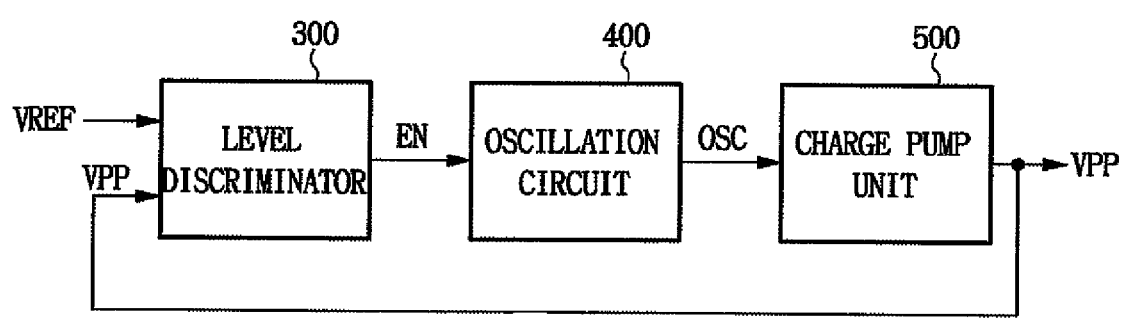
FIG. 8 is a block diagram of a voltage generating circuit including an oscillation circuit, illustrating an example including the oscillation circuit according to example embodiments.

FIG. 8 is a block diagram of a voltage generating circuit including an oscillation circuit according to example embodiment of the inventive concept.

As shown in FIG. 8, the voltage generating circuit comprises a level discriminator 300, an oscillation circuit 400, and a charge pump unit 500.

The level discriminator 300 compares a high voltage VPP with a reference voltage VREF to activate an oscillation enable signal EN when the high voltage VPP is lower than the reference voltage VREF or to deactivate the oscillation enable signal EN when the high voltage VPP is higher than the reference voltage VREF.

The oscillation circuit 400 includes a plurality of inverters. When the oscillation enable signal EN is activated, signal transmission between first and second nodes of the inverters is performed such that the oscillation operation is performed through the respective inverters to generate a plurality of clock signals. In this case, one of the clock signals is output as a periodic signal. On the other hand, when the oscillation enable signal EN is deactivated, the clock signal of the second node is latched after the voltage level of the clock signal of the second node is stabilized, and the signal transmission between the first and second nodes is cut off to stop the oscillation operation.

The charge pump unit 500 charge pumps the high voltage VPP in response to the periodic signal OSC to increase the level of the high voltage VPP. That is, the voltage generating circuit keeps pumping until the level of the high voltage VPP is identical to that of the reference voltage VREF. FIG. 8 illustrates an example in which the oscillation circuit is applied to the voltage generating circuit. However, the oscillation circuit may be applied to various circuits of a semiconductor device.

As described above, when the oscillation enable signal EN is activated, the oscillation circuit according to example embodiments activates the control signal CON and performs the oscillation operation to generate the periodic signal OSC. On the other hand, when the oscillation enable signal EN is deactivated, the oscillation circuit deactivates the control signal CON after a signal of a node to which signal transmission is to be cut off by the transmission gate is stabilized, and stably stops the oscillation operation.

According to example embodiments, an oscillation circuit and a semiconductor device having the same can rapidly and stably terminate the oscillation operation when an oscillation enable signal is deactivated.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. An oscillation circuit, comprising:
   an oscillation unit including a plurality of inverters and a transmission unit and configured to perform signal transmission between first and second nodes such that each of the inverters performs an oscillation operation to generate clock signals having different phases, when a control signal is activated, and latch a clock signal of the second node and cut off the signal transmission between the first and second nodes to stop the oscillation operations of the inverters, when the control signal is deactivated; and
   a control unit configured to activate the control signal when an oscillation enable signal is activated, and deactivate the control signal using a clock signal output from an inverter connected to the second node among the plurality of inverters and one of clock signals of which phases lead that of a clock signal of the first node, when the oscillation enable signal is deactivated,
   wherein the first node is directly connected to input terminal of the transmission unit and the second node is directly connected to output terminal of the transmission unit.

2. The oscillation circuit according to claim 1, wherein the oscillation unit includes:
   a delay unit including at least one inverter among the plurality of inverters and configured to receive one of clock signals of which phases lag that of the second node and sequentially oscillate the clock signal through the at least one inverter to output to the first node;
   the transmission unit connected between the first and second nodes and configured to transmit the clock signal of the first node to the second node during the activation period of the control signal; and
   a latch unit configured to oscillate the clock signal of the second node when the control signal is activated, and latch the clock signal of the second node when the control signal is deactivated.

3. The oscillation circuit according to claim 1, wherein the control unit receives an input signal of an inverter connected to the first node as a first detection signal and an output signal of an inverter connected to the second node as a second detection signal, and when the voltage levels of the first and second detection signals are all stabilized, determines that the voltage level of the clock signal of the second node is stabilized and deactivates the control signal.

4. The oscillation circuit according to claim 3, wherein the control unit includes:
   a reset signal generator configured to generate a reset signal which is activated after the oscillation enable signal is deactivated and the voltage levels of the first and second detection signals are all stabilized; and
   a control signal generator configured to generate the control signal which is deactivated after the oscillation enable signal is deactivated and the reset signal is activated.

5. The oscillation circuit according to claim 4, wherein the reset signal generator includes a level setting unit configured to deactivate the reset signal during the activation period of the oscillation enable signal.

6. A semiconductor device, comprising:
   a voltage generating circuit, including
   a level discriminator configured to compare a reference voltage and an output voltage and activate an oscillation enable signal when the output voltage is lower than the reference voltage or deactivate the oscillation enable signal when the output voltage is higher than the reference voltage;
   an oscillation circuit configured to generate a periodic signal in response to the oscillation enable signal; and
   a charge pump unit configured to pump the output voltage in response to the periodic signal to adjust a level of the output voltage,
   wherein the oscillation circuit includes:
   an oscillation unit including a plurality of inverters and a transmission unit and configured to perform signal transmission between first and second nodes such that each of the inverters performs an oscillation operation to generate clock signals having different phases, when a control signal is activated, and latch a clock signal of the second node and cut off the signal transmission between the first and second nodes to stop the oscillation operations of the inverters, when the control signal is deactivated; and
   a control unit configured to activate the control signal when the oscillation enable signal is activated, and deactivate the control signal using a clock signal output from an inverter connected to the second node among the plurality of inverters and one of clock signals of which phases lead that of a clock signal of the first node, when the oscillation enable signal is deactivated,
   wherein the first node is directly connected to input terminal of the transmission unit and the second node is directly connected to output terminal of the transmission unit.

7. The semiconductor device according to claim 6, wherein the oscillation unit includes:
   a delay unit including at least one inverter among the plurality of inverters and configured to receive one of clock signals of which phases lag that of the second node and sequentially oscillate the clock signal through the at least one inverter to output to the first node;
   the transmission unit connected between the first and second nodes and configured to transmit the clock signal of the first node to the second node during the activation period of the control signal; and
   a latch unit configured to oscillate the clock signal of the second node when the control signal is activated, and latch the clock signal of the second node when the control signal is deactivated.

8. The semiconductor device according to claim 6, wherein the control unit receives an input signal of an inverter connected to the first node as a first detection signal and an output signal of an inverter connected to the second node as a second detection signal, and when the voltage levels of the first and second detection signals are all stabilized, determines that the voltage level of the clock signal of the second node is stabilized and deactivates the control signal.

9. The semiconductor device according to claim 8, wherein the control unit includes:
  a reset signal generator configured to generate a reset signal which is activated after the oscillation enable signal is deactivated and the voltage levels of the first and second detection signals are all stabilized; and
  a control signal generator configured to generate the control signal which is deactivated after the oscillation enable signal is deactivated and the reset signal is activated.

10. The semiconductor device according to claim 9, wherein the reset signal generator includes a level setting unit configured to deactivate the reset signal during the activation period of the oscillation enable signal.

* * * * *